United States Patent
Hsu

(10) Patent No.: US 9,704,577 B2
(45) Date of Patent: Jul. 11, 2017

(54) TWO TRANSISTOR SONOS FLASH MEMORY

(71) Applicant: NEO Semiconductor, Inc., San Jose, CA (US)

(72) Inventor: Fu-Chang Hsu, San Jose, CA (US)

(73) Assignee: NEO Semiconductor, Inc., San Jose, CA (US)

( * ) Notice: Subject to any disclaimer, the term of this patent is extended or adjusted under 35 U.S.C. 154(b) by 0 days.

(21) Appl. No.: 15/090,451

(22) Filed: Apr. 4, 2016

(65) Prior Publication Data

US 2016/0293256 A1 Oct. 6, 2016

Related U.S. Application Data

(60) Provisional application No. 62/143,143, filed on Apr. 5, 2015.

(51) Int. Cl.
*G11C 16/04* (2006.01)
*G11C 16/06* (2006.01)
*G11C 16/10* (2006.01)
*H01L 27/1157* (2017.01)

(52) U.S. Cl.
CPC ...... *G11C 16/0433* (2013.01); *G11C 16/0466* (2013.01); *G11C 16/06* (2013.01); *G11C 16/10* (2013.01); *H01L 27/1157* (2013.01)

(58) Field of Classification Search
CPC ....................................................... G11C 16/04
USPC ........................................ 365/185.01–185.33
See application file for complete search history.

(56) References Cited

U.S. PATENT DOCUMENTS

| | | | | |
|---|---|---|---|---|
| 4,467,453 | A * | 8/1984 | Chiu | G11C 16/0416 257/316 |
| 4,493,057 | A * | 1/1985 | McElroy | G11C 11/404 257/316 |
| 7,894,257 | B1 | 2/2011 | Prabhakar | |
| 8,320,192 | B2 | 11/2012 | Akil et al. | |
| 8,355,282 | B2 | 1/2013 | Ching et al. | |
| 8,446,763 | B2 | 5/2013 | Nam | |
| 2003/0103382 | A1* | 6/2003 | Kobayashi | H01L 27/105 365/185.27 |

(Continued)

OTHER PUBLICATIONS

International Search Report, mailing date of Jul. 12, 2016, for corresponding International Application No. PCT/US2016/025916.

(Continued)

*Primary Examiner* — Harry W Byrne
(74) *Attorney, Agent, or Firm* — Intellectual Property Law Group LLP

(57) ABSTRACT

A two transistor SONOS flash memory is disclosed. In one aspect, an apparatus, includes a control gate transistor having source and drain diffusions deposited in an N-well, a charge-trapping region formed on the N-well that overlaps the source and drain diffusions, and a control gate formed on the charge-trapping region. A channel region of the N-well between the source and drain diffusions is less than 90 nm in length. The apparatus also includes a select gate transistor having a select source diffusion deposited in the N-well. A drain side of the select gate transistor shares the source diffusion. A channel region of the N-well between the select source diffusion and the source diffusion also is less than 90 nm in length.

16 Claims, 9 Drawing Sheets

(56) References Cited

U.S. PATENT DOCUMENTS

2004/0191993 A1* 9/2004 Kobayashi ............ H01L 27/105
 438/266
2005/0145924 A1 7/2005 Liu et al.

OTHER PUBLICATIONS

Written Opinion of the International Searching Authority, mailing date of Jul. 12, 2016, for corresponding International Application No. PCT/US2016/025916.

* cited by examiner

TWO TRANSISTOR SONOS FLASH MEMORY

PRIORITY

This application claims the benefit of priority based upon U.S. Provisional Patent Application having Application No. 62/143,143, filed on Apr. 5, 2015, and entitled "2T SONOS Flash Memory," which is hereby incorporated herein by reference in its entirety.

FIELD OF THE INVENTION

The exemplary embodiments of the present invention relate generally to the field of semiconductors and integrated circuits, and more specifically to memory and storage devices.

BACKGROUND OF THE INVENTION

A tradition flash memory may comprise silicon-oxide-nitride-oxide-silicon (SONOS) cells having a two-transistor (2T) structure that prevents over-erase and drain voltage disturb. However, during programming, the cell's channel has to sustain a 5V punch-through voltage and therefore the channel length of the conventional 2T SONOS cell cannot be scaled down below a set limit. For example, the 2T SONOS cell may be programmed using Channel-Hot-Hole-Induced-Hot-Electron (CHHIHE) injection. During this type of programming, the drain to source voltage (VDS) of the cells is typically set to five volts to produce high channel current. Typically, a large charge-pump circuit is utilized to produce this high channel current. This increases the die size and cost and is particularly not suitable for lower density applications. The high VDS requirement also significantly limits the scalability of the cell's channel length and therefore the overall array size.

The 2T SONOS cells may also be programmed using Band-To-Band-Tunneling (BTBT) injection. During this type of programming, the cell's VDS is also 5V. Again, the high VDS requirement significantly limits the scalability of the cell's channel length. Thus, the overall size of conventional flash memory is determined by the size of any required charge-pump circuitry and the scalability of the 2T SONOS cells. As a result, the overall size cannot be reduced below that which is necessary to support the required channel length of the cells.

It is therefore desirable to have a flash memory that utilizes two transistor memory cells and that overcomes the problems of scalability associated with conventional flash memories.

SUMMARY

In various exemplary embodiments, a novel flash memory comprising two transistor memory cells is disclosed. The memory cells can be either SONOS cells or floating gate cells. Also, several novel programming bias conditions are disclosed that reduce the cells' punch-through voltage during programming, and thus allow the cells' channel length to be significantly reduced when compared to conventional circuits.

In one aspect, an apparatus includes a control gate transistor having source and drain diffusions deposited in an N-well, a charge-trapping region formed on the N-well that overlaps the source and drain diffusions, and a control gate formed on the charge-trapping region. A channel region of the N-well between the source and drain diffusions is less than 90 nm in length. The apparatus also includes a select gate transistor having a select source diffusion deposited in the N-well. A drain side of the select gate transistor shares the source diffusion. A channel region of the N-well between the select source diffusion and the source diffusion also is less than 90 nm in length.

In another aspect, a method is provided for operating a plurality of memory cells that form a flash memory array. Each memory cell comprises a select gate transistor and a control gate transistor, and each transistor comprises a channel region that is less than 90 nm in length. The method comprises setting an N-well bias level, setting a bit line voltage based on the N-well bias level to generate electron/hole pairs in a drain region of the control gate transistor, and enabling the select gate transistor to pass a voltage to a source diffusion of the control gate transistor to enable a punch through current to flow in the channel region of the control gate transistor. The method also comprises setting a gate voltage of the control gate transistor to inject electrons into a charge-trapping layer of the control gate transistor using Punch-Through-Assisted-Hot-Electron (PAHE) injection.

Additional features and benefits of the present invention will become apparent from the detailed description, figures and claims set forth below.

BRIEF DESCRIPTION OF THE DRAWINGS

The exemplary embodiments of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Exemplary embodiments of the present invention are described herein in the context of a process, device, method, and apparatus for providing a novel flash memory utilizing 2T memory cells, such as SONOS cells or floating gate cells.

Those of ordinary skill in the art will realize that the following detailed description is illustrative only and is not intended to be in any way limiting. Other embodiments of the present invention will readily suggest themselves to such skilled persons having the benefit of this disclosure. Reference will now be made in detail to implementations of the exemplary embodiments of the present invention as illustrated in the accompanying drawings. The same reference indicators (or numbers) will be used throughout the drawings and the following detailed description to refer to the same or like parts.

It should be noted that the exemplary embodiments are not limited to SONOS cells only and can be applied with any other type of charge-trapping cells. To realize the low-cost, high-flexibility flash memory using SONOS or other charge-trapping type of cells, the exemplary embodiments disclose a novel array and novel operating conditions. These embodiments and conditions allow the array to be reduced in size while still performing normal Flash memory operations.

Figure 1:
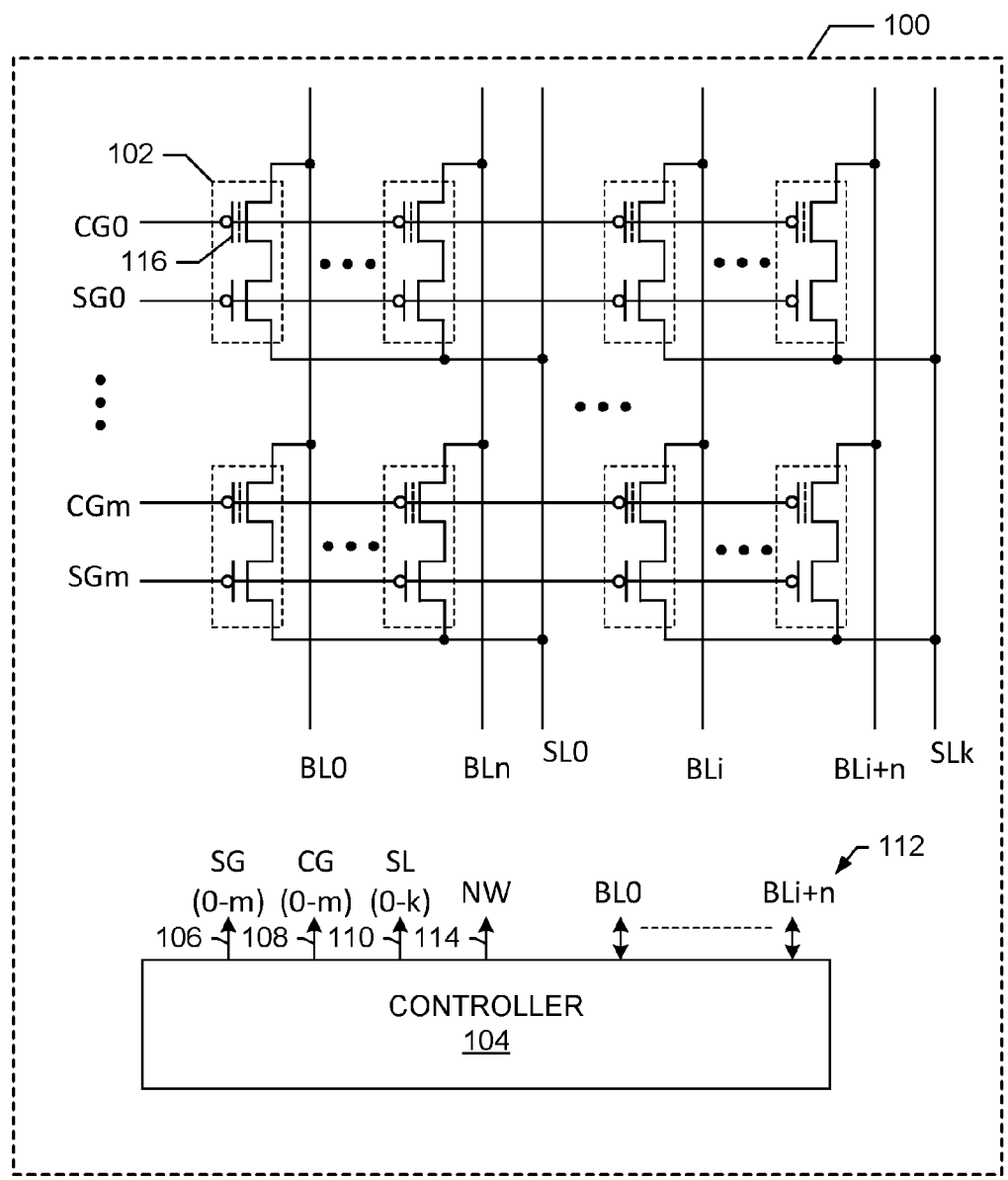
FIG. 1 shows an exemplary embodiment of a flash memory array that utilizes an exemplary 2T memory cell structure in accordance with the invention.

FIG. 1 shows an exemplary embodiment of a flash memory array 100 that utilizes an exemplary two transistor memory cell structure in accordance with the invention. For example, the memory array 100 is structured as a "NOR" array where multiple bit lines (BL) share a common source line (SL).

The memory array 100 comprises 2T memory cells, such as memory cell 102, that are programmed, erased, and read using control signals generated by controller 104. For example, in an exemplary embodiment, the memory cells comprise 2T SONOS cells or 2T floating gate cells. The controller 104 comprises at least one of a CPU, processor, state machine, discrete logic, RAM, ROM and/or any other suitable hardware.

During operation, the controller 104 outputs select gate (SG) 106 control signals, control gate (CG) 108 control signals, and source line (SL) 110 control signals that are coupled to the memory array. A plurality of bit lines (BL) 112 carry data between the memory array and the controller 104. The controller 104 also outputs an N-well bias voltage 114 that is coupled to the memory cells. Thus, the controller 104 uses the various control and bias signals to store and retrieve data to and from the memory cells.

In an exemplary embodiment, the memory cells comprise a select gate transistor and a control gate transistor. The control gate transistor, such as transistor 116, acts as a storage cell to store charge. The control gate transistor comprises one of a charge-trapping layer or a floating gate to store charge. In an exemplary embodiment, the control gate transistor is structured to have a short channel length when compared to conventional memory cells used in flash memory. For example, in an exemplary embodiment, the channel length is less than 90 nm and can be as short as 10 nm. The short channel length results in smaller device size and therefore a smaller memory array. The short channel length also results in lower bias voltages for programming, erasing, and reading the memory cells. A more detailed description of the memory cells is provided below.

Figure 2:
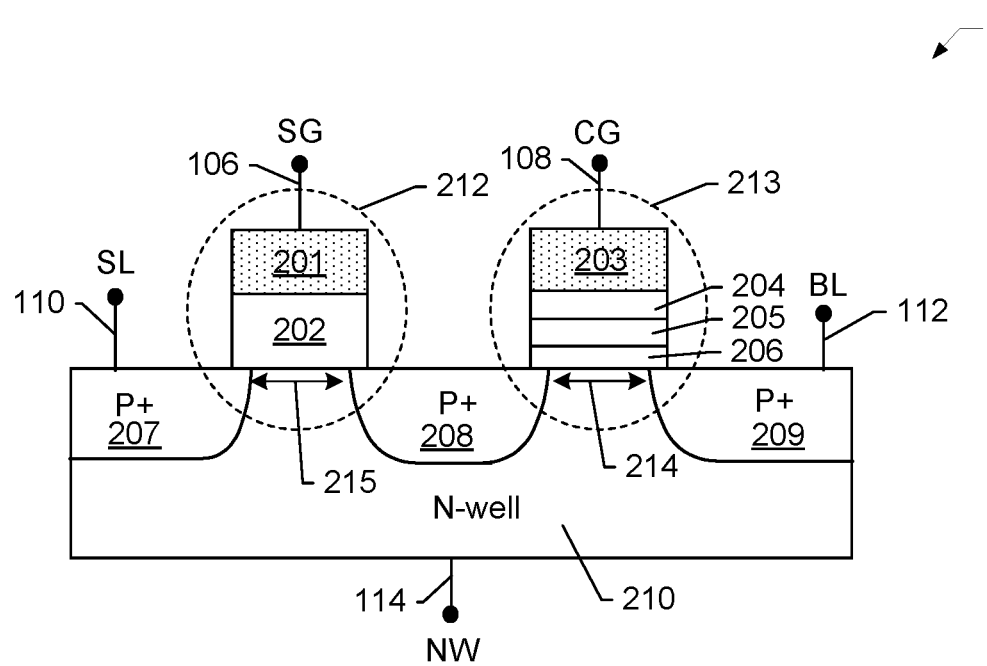
FIG. 2 shows an exemplary embodiment of a 2T cell structure in accordance with the invention.

FIG. 2 shows an exemplary embodiment of a 2T SONOS cell structure 200 constructed in accordance with invention. For example, the cell structure 200 is suitable for use as the memory cells (e.g., 102) shown in FIG. 1.

The cell structure 200 comprises a select gate transistor 212 that includes select gate 201 and gate oxide 202. The cell structure 200 also comprises a control gate transistor 213 that comprises control gate 203, top dielectric layer 204, such as oxide, charge-trapping layer 205, such as nitride, and bottom dielectric layer 206, such as oxide. The layers 204, 205, and 206 are referred to as "ONO" layers. The transistors 212 and 213 also comprise P+ diffusion regions 207, 208, and 209 deposited in an N-well 210.

In an exemplary embodiment, the SL control line 110 is coupled to the P+ diffusion 207, the SG control line 106 is coupled to the select gate 201, the CG 108 control line is coupled to the control gate 203 and one of the BL 112 is coupled to the P+ diffusion 209. The NW bias signal 114 is coupled to the N-well 210. Thus, in the embodiment shown in FIG. 2, the storage transistor 213 is located in the drain side or the bit line side of the memory cell.

In an exemplary embodiment, the storage transistor 213 is constructed to have a short channel 214. For example, in an exemplary embodiment, the length of the channel 214 is less than 90 nm. In another embodiment, the channel length is less than 60 nm, and in still another embodiment, the channel length as short as 10 nm. In an exemplary embodiment, the length of the channel 215 of the transistor 212 is also less than 90 nm and as short as 10 nm. The short channel lengths result in a smaller memory cell and thus an overall smaller memory array. The short channel lengths also result in lower bias voltages.

Figure 3:
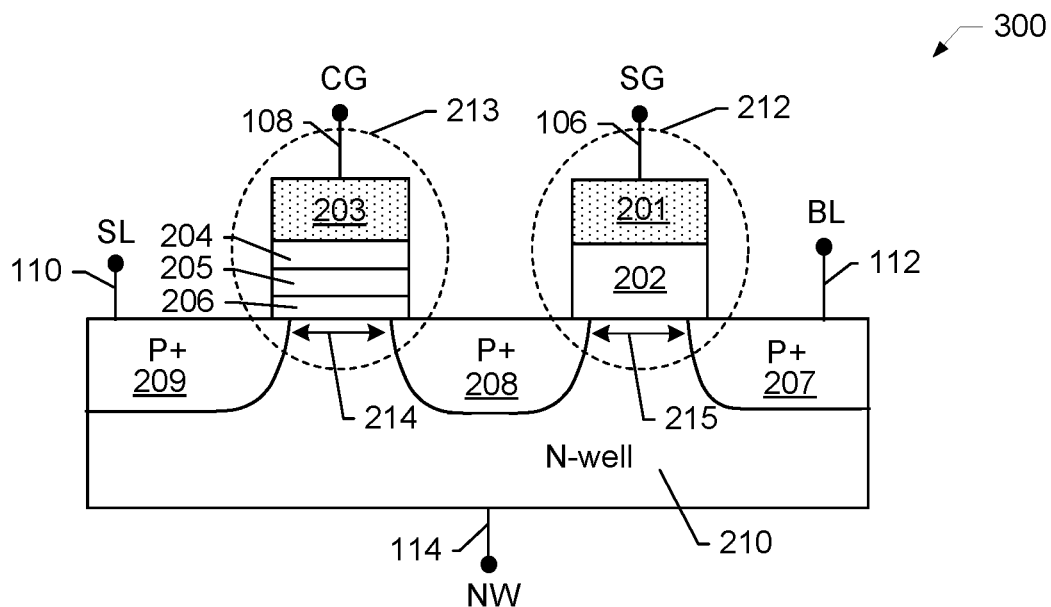
FIG. 3 shows an exemplary embodiment of a 2T cell structure in accordance with the invention.

FIG. 3 shows another exemplary embodiment of a 2T SONOS cell structure 300 in accordance with the invention. The cell structure 300 is similar to the cell structure 200 except that the storage transistor 213 is located on the source side of the memory cell rather than on the BL side. Similarly, the transistor 213 shown in FIG. 3 has a short channel 214 as described above. For example, in an exemplary embodiment, the channel 214 has a length less than 90 nm and as short as 10 nm. The channel 215 also has a length less than 90 nm and as short as 10 nm.

Figure 4:
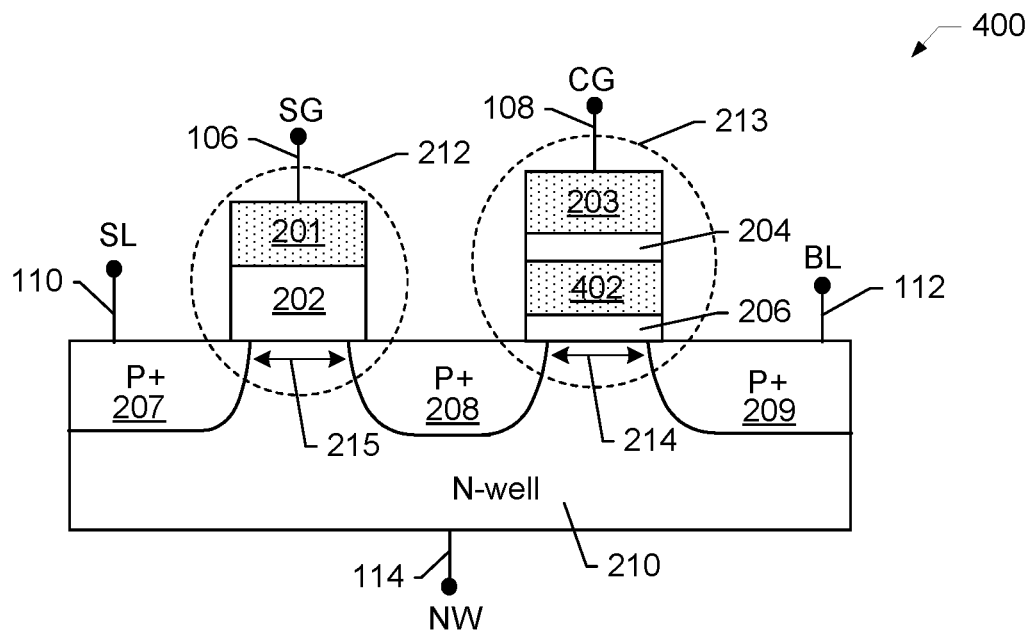
FIG. 4 shows an exemplary embodiment of a 2T cell structure in accordance with the invention.

FIG. 4 shows an exemplary embodiment of a 2T floating gate cell structure 400 constructed in accordance with the invention. The cell structure 400 is similar to the cell structure 200 except that the layer 402 is a floating gate (FG) layer instead of the charge-trapping layer 205 shown in FIG. 2. Similarly, the transistor 213 shown in FIG. 4 has a short channel 214 as described above. For example, in an exemplary embodiment, the channel 214 has a length less than 90 m and as short as 10 nm.

Figure 5:
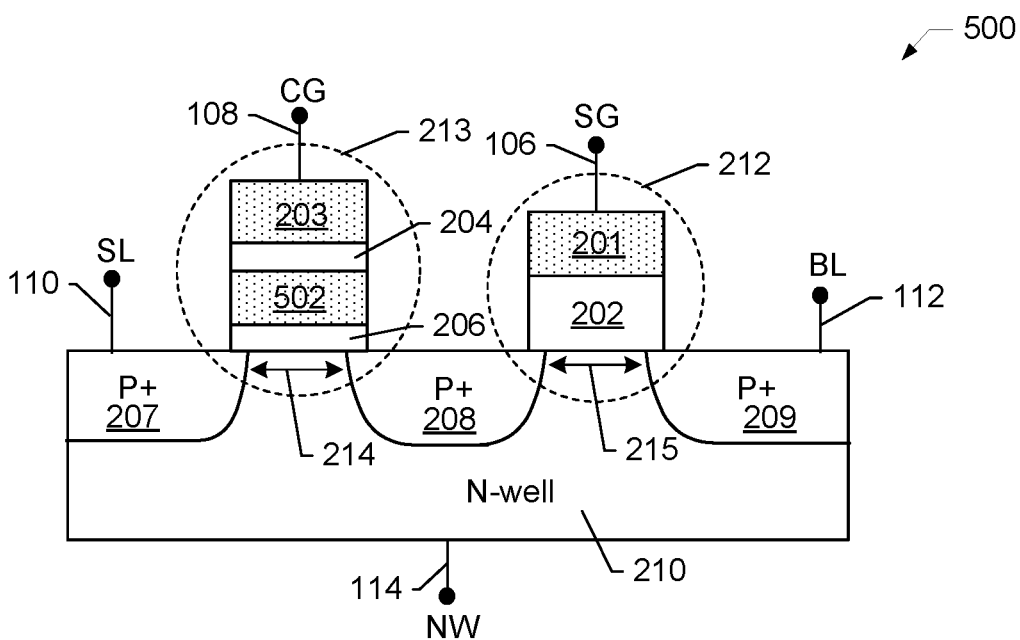
FIG. 5 shows an exemplary embodiment of a 2T cell structure in accordance with the invention.

FIG. 5 shows another exemplary embodiment of a 2T floating gate cell structure 500 in accordance with the invention. The cell structure 500 is similar to the cell structure 300 except that the layer 502 is a floating gate layer instead of a charge-trapping layer 205 as shown in FIG. 3. Similarly, the transistor 213 shown in FIG. 5 has a short channel 214 as described above. For example, in an exemplary embodiment, the channel 214 has a length less than 90 nm and as short as 10 nm.

Figure 6:
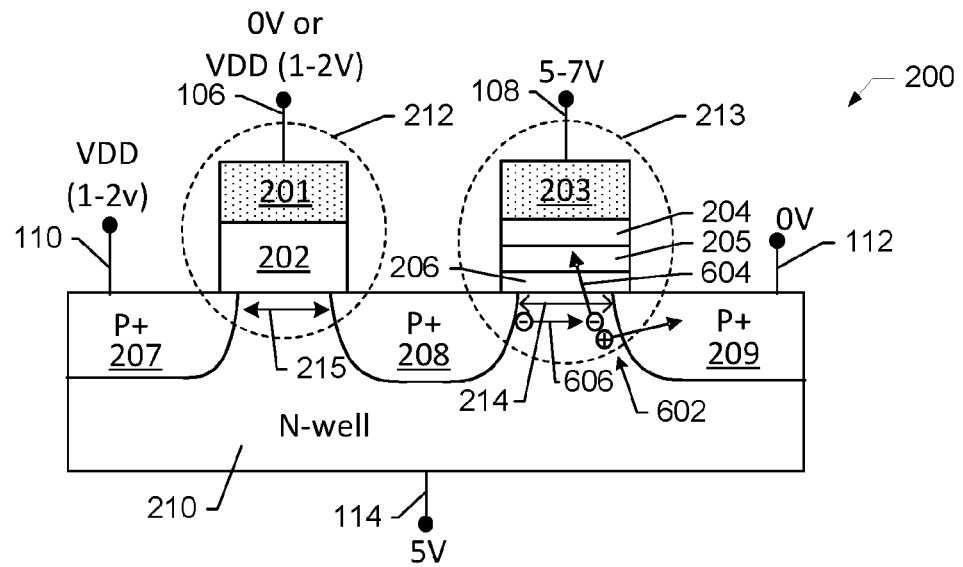
FIG. 6 shows an exemplary embodiment of program bias conditions to program the novel memory cell structure shown in FIG. 2.

FIG. 6 shows an exemplary embodiment of program bias conditions to program the novel 2T SONOS cell structure 200. For example, the controller 104 outputs the disclosed control and bias signals to implement Band-To-Band-Tunneling (BTBT) injection to program the 2T SONOS cell 200. In an exemplary embodiment, the controller 104 supplies the N-well 210 with a high voltage signal, such as 5V to 6V, using the NW bias 114. The controller 104 supplies the BL 112 with a low voltage signal, such as 0V to −1V. The voltage difference between the BL 112 and the N-well 210 will cause avalanche breakdown to occur in the drain junction of the storage transistor 213, which will generate many electron-hole pairs at this junction, as indicated at 602.

The controller 104 supplies the control gate 203 of the transistor 213 with a high voltage signal, such as 5-7V, using the control gate signal 108. This voltage will attract electrons to inject into the charge-trapping layer 205, as indicated at 604. The result is that the cell (e.g., storage transistor 213) is programmed to be an "on-cell."

However, in contrast to conventional circuits, the controller 104 supplies the source region 207 with a low voltage, such as 1-2V (e.g., VDD) using the SL control signal 110. Conventional circuits typically apply 5V instead. The lower voltage can be directly supplied from VDD that is typically 1.2V or 1.8V. This significantly reduces the VDS of the transistor 212 to 1-2V, instead of 5V as used in conventional circuits. Therefore, the channel 215 length of the transistor 212 can be scaled down due to the lower VDS. For the case where VDD is 3V, the source voltage can be clamped from VDD to 1-2V and then applied. In another embodiment, the 3V VDD is directly applied to the source diffusion 207. Although this will increase the cell's VDS to 3V; this is still a 2V reduction when compared with conventional circuits.

In an exemplary embodiment, the select gate 201 is supplied with VDD to turn off the select gate transistor 212. This causes the source region 208 of the transistor 213 to be floating and therefore the cell (storage transistor 213) can be programmed by BTBT injection as described above.

According to another exemplary embodiment, the memory cell 200 is programmed using a mechanism called Punch-Through-Assisted-Hot-Electron (PAHE) injection. In an exemplary embodiment, the controller 104 supplies the select gate 201 with a low voltage, such as 0V to −1V, to turn on the select gate transistor 212. The SL voltage at the diffusion 207 (e.g., 1-2V) will pass through the channel of the transistor 212 to the source diffusion 208 of the transistor 213. The voltage on the source diffusion 208 will cause the transistor 213 to experience punch-through, especially since the channel length 214 of the transistor 213 is reduced in accordance with the invention. A low punch through current 606 will flow through the channel of the transistor 213. The current 606 will accelerate the electrons (shown at 602) at the drain junction to become 'hot' electrons, and thus greatly increase the efficiency of the injection of electrons (shown at 604) into the charge-trapping layer 205. PAHE injection programming may increase the programming speed by one order of magnitude over BTBT injection programming. The typical punch-through current is approximately 1 nA to 1 uA, depending on the voltage and channel length. These parameters can be carefully selected by the design of the memory cell (e.g., transistor 213). After programming, the cell (transistor 213) becomes an on-cell.

Because the overall punch through voltage from SL to BL is about 1V, the shortest channel length for the channels 214, 215 is approximately 10 nm. If the process is tuned, such as by increasing the punch-through implant concentration, the channel length for the channels 214, 215 may be further reduced to below 10 nm, which will be in the approximate range of 5-7 nm.

It should be noted that when the select gate 201 is supplied with a low voltage, such as 0V to −1V, the junction at the source diffusion 207 will have 3-4V reverse-bias voltage because the SL voltage can be 1-2V. This voltage will not cause avalanche breakdown, and thus it will not affect the reliability of the select gate transistor 212. Even if a breakdown happens, the electrons will be attracted by the voltage on the N-well 210 and the holes will be attracted by the SL voltage. Thus, no major electron or hole injection will happen to the select gate 201. It should also be noted that another advantage of the disclosed program bias conditions is that both the BL and SL voltages can be directly supplied from VDD and VSS, instead of using positive or negative charge pump circuits as in conventional circuits. Therefore, even if the cell channel is punched through significantly and causes a large leakage current, it will not cause the programming to fail. In contrast with conventional circuits, where the BL or SL voltage is generated by a charge pump circuit, if the cell is significantly punched through, the leakage current may exceed the charge-pump's supply current. Then the BL or SL voltage will be dropped and result in programming failure. Moreover, in accordance with the invention, any utilized charge-pump circuit only supplies voltages to the N-well and gates, and therefore its supply current is very low allowing these charge-pump devices to be small in size.

Figure 7:
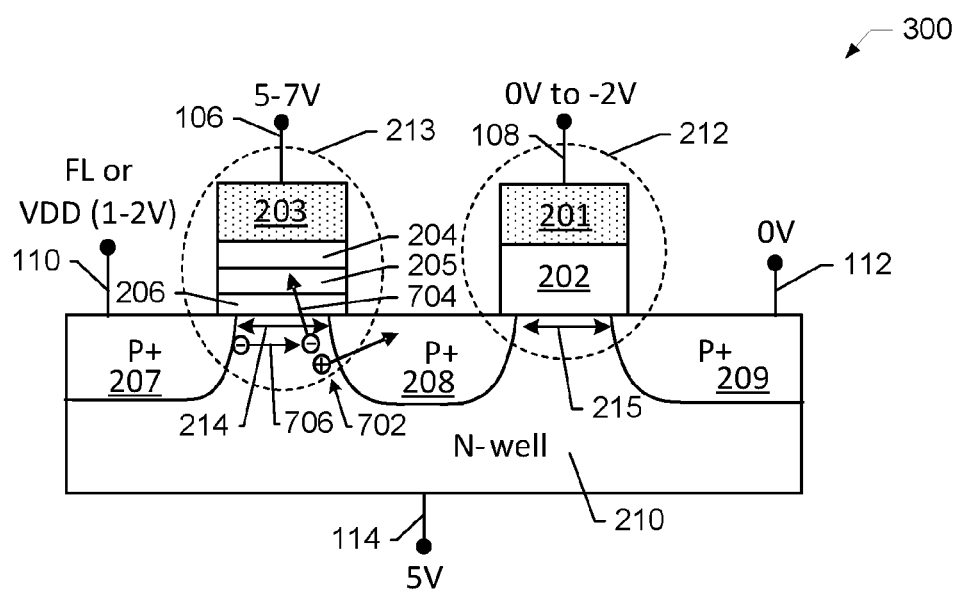
FIG. 7 shows an exemplary embodiment of program bias condition to program the novel memory cell structure shown in FIG. 3.

FIG. 7 shows an exemplary embodiment of program bias conditions to program the novel 2T SONOS cell structure 300 shown in FIG. 3. It should be noted that the cell 300 can be programmed using BTBT or PAHE injection according to the invention. The program bias conditions illustrated in FIG. 7 are similar to those disclosed with reference to FIG. 6, except that the controller 104 supplies the select gate 201 with a low voltage such as 0V to −2V to pass the 0V on the BL 112 to the drain region of the diffusion 208 of the transistor 213. For BTBT injection programming, the controller sets the SL 110 to a floating condition and therefore there is no channel leakage current across the channel 214 from the source 207 to the drain 208 of the transistor 213 to enhance the electron injection efficiency. The voltage difference between the drain side diffusion 208 and the N-well 210 will cause avalanche breakdown to occur in the drain junction of the storage transistor 213, which will generate many electron-hole pairs at this drain junction, as indicated at 702.

The controller 104 supplies the control gate 203 of the transistor 213 with a high voltage signal, such as 5-7V, using the control gate signal 108. This voltage will attract electrons to inject into the charge-trapping layer 205, as indicated at 704. The result is that the cell (e.g., storage transistor 213) is programmed to be an "on-cell."

For PAHE programming, the controller 104 supplies the SL 110 with a low VDD voltage, such as 1-2V. This will generate punch-through current 706 due to the short channel 214 of the transistor 213, which accelerates the electrons near the drain junction 702, and therefore significantly increases the injection efficiency of electrons into the charge-trapping region 205.

Figure 8:
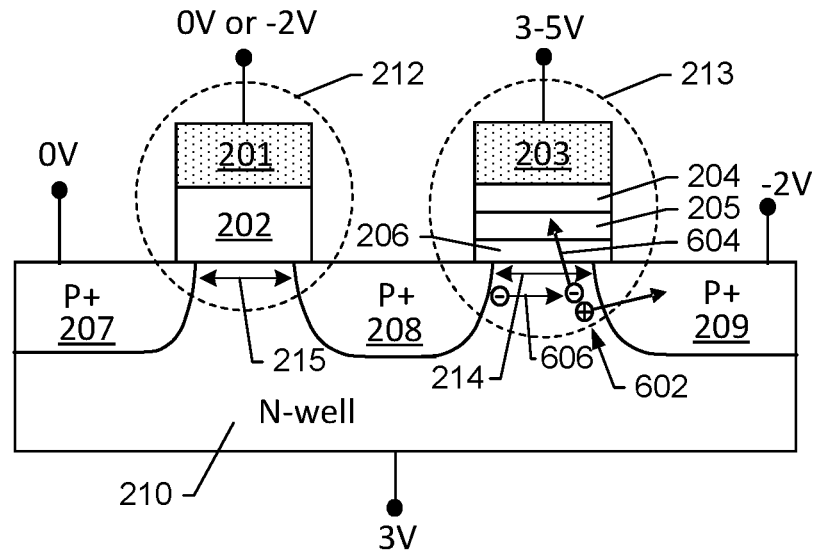
FIG. 8 shows an exemplary embodiment of the program condition according to the invention.

FIG. 8 shows another exemplary embodiment of the program bias conditions according to the invention. This embodiment is similar to the embodiment shown in FIG. 6 except that all the voltages are negatively shifted by 2V. By shifting the voltages, the SL can be directly supplied with 0V; however, to generate the −2V for the BL voltage, a charge-pump circuit may be needed.

Figure 9:
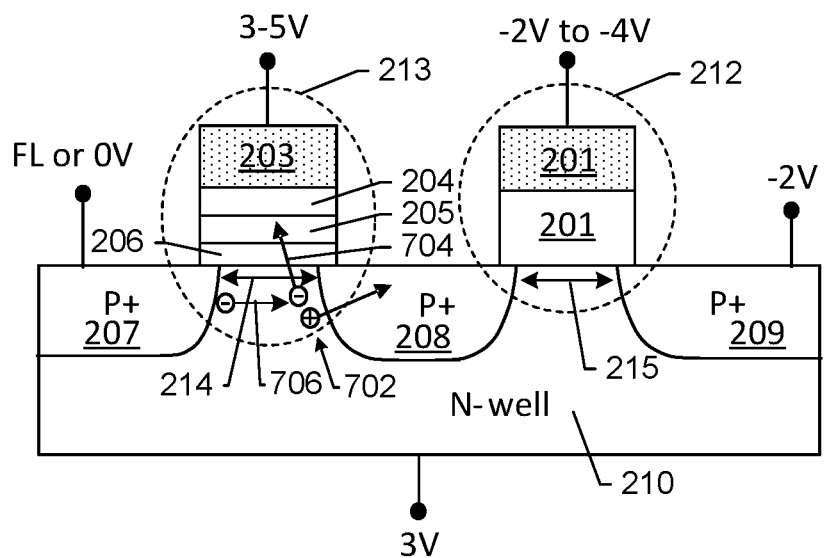
FIG. 9 shows an exemplary embodiment of the program condition according to the invention.

FIG. 9 shows an embodiment of the program bias condition according to the invention. This embodiment is similar to the embodiment shown in FIG. 7 except all the voltages are negatively shifted 2V. Similar to the previous embodiment, the SL voltage can be directly supplied with 0V; however, the −2V supplied as the BL voltage may need to be generated by a charge-pump circuit.

Figure 10:
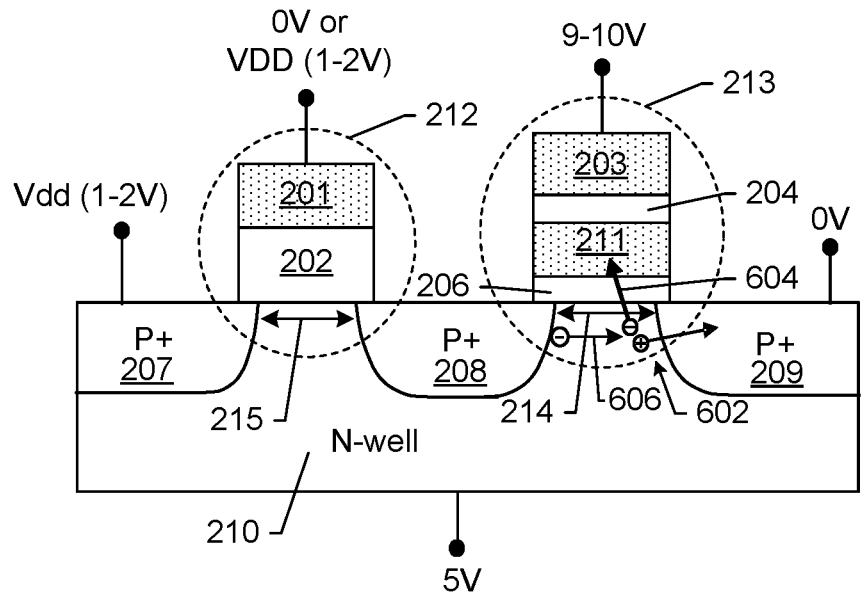
FIG. 10 shows an exemplary embodiment of program bias conditions that can be applied to the embodiment shown in FIG. 4 according to the invention.

FIG. 10 shows another exemplary embodiment of program bias conditions that can be applied to the embodiment shown in FIG. 4. The program bias conditions for this embodiment are similar to the program bias shown in FIG. 6 except that the voltages may be higher in order to compensate for the coupling-ratio of the floating gate 211. It should also be noted that similar to program bias conditions shown in FIG. 8, the voltages of this embodiment can be also negatively shifted by 2V or any other suitable voltage.

Figure 11:
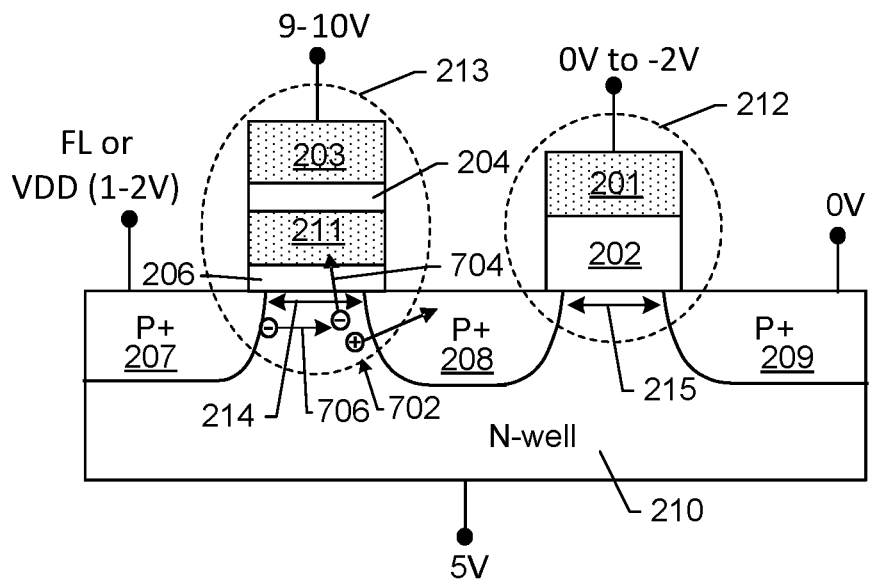
FIG. 11 shows another exemplary embodiment of program bias conditions that can be applied to the embodiment show in FIG. 5 according to the invention.

FIG. 11 shows another exemplary embodiment of program bias conditions that can be applied to the embodiment show in FIG. 5. The program bias conditions for this embodiment are similar to the embodiment shown in FIG. 7 except that the voltages may be higher in order to compensate for the coupling-ratio of the floating gate. Please notice that similar to the program bias conditions shown in FIG. 9, the voltages of this embodiment can be also negatively shifted by 2V or any other suitable voltage.

In another exemplary embodiment, the cell can be implemented as a floating gate cell rather than a charge-trapping cell. In this embodiment, the above-described bias conditions and operations are applicable except that higher voltages may be applied to the N-well and CG to compensate for the coupling-ratio of the floating gate.

Figure 12:
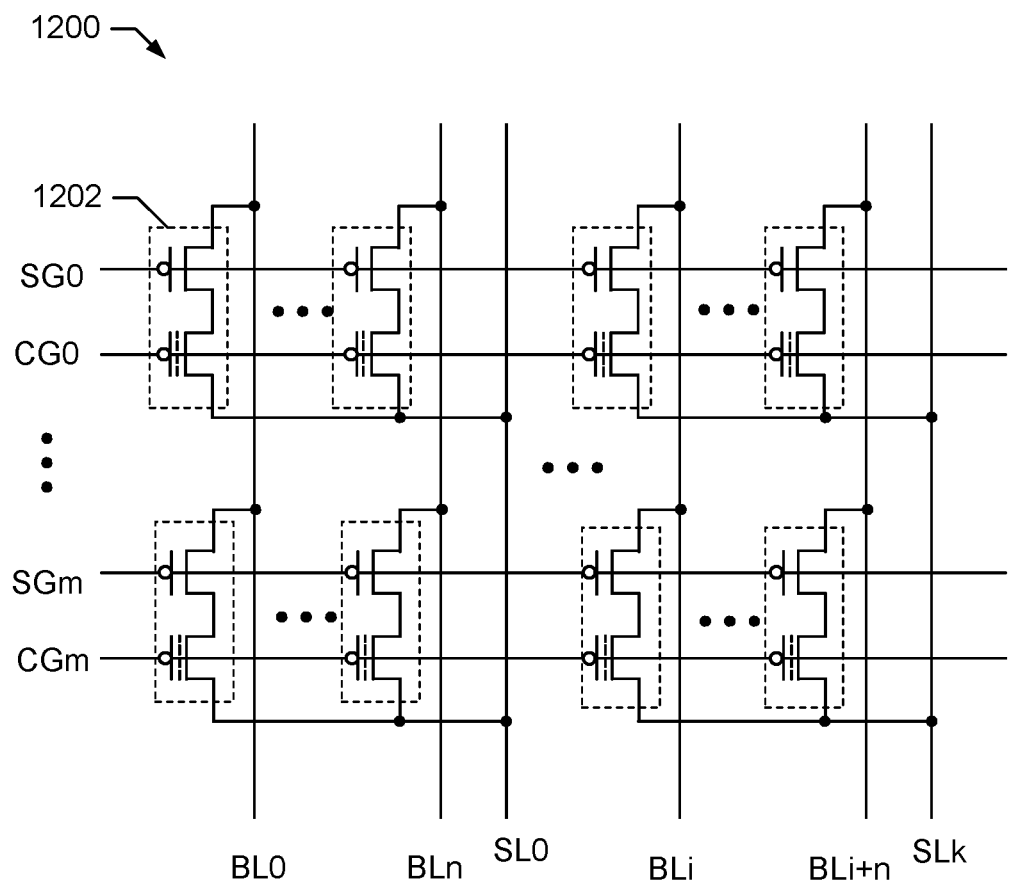
FIGS. 12-14 show exemplary embodiments of arrays comprising novel 2T memory cells constructed in accordance with the invention.
Figure 13:
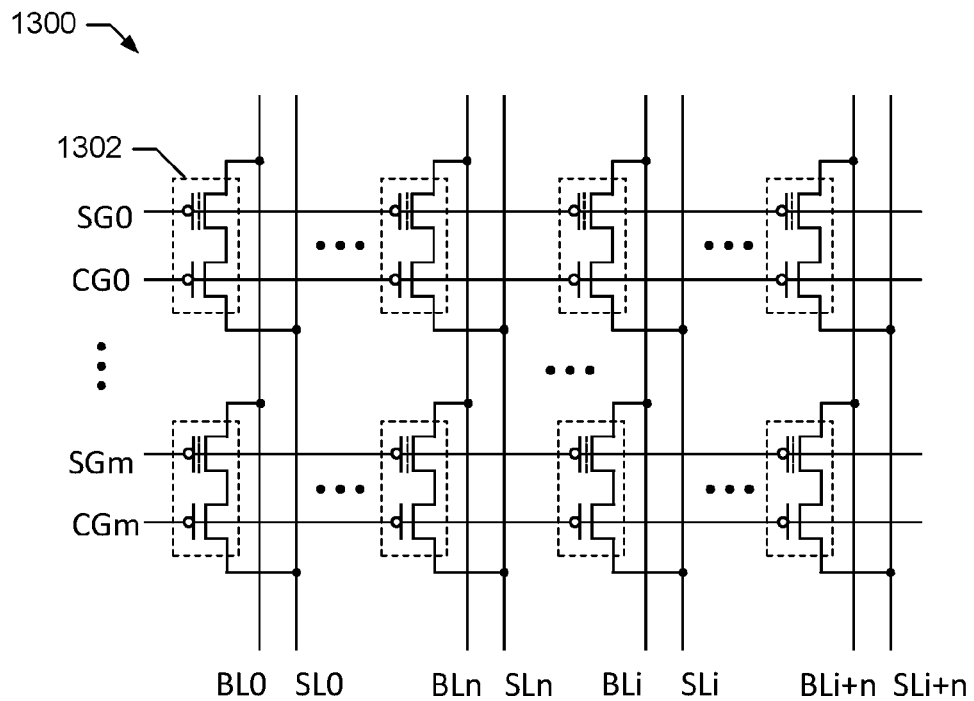
Figure 14:
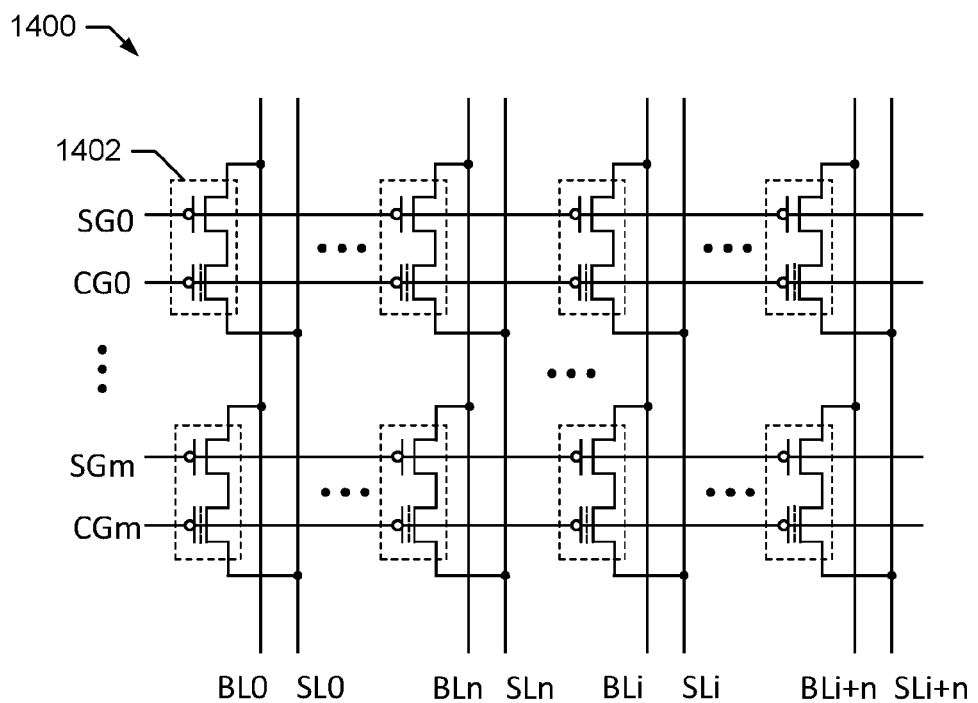

FIGS. 12-14 show exemplary embodiments of arrays comprising novel 2T memory cells constructed in accordance with the invention.

FIG. 12 shows an exemplary embodiment of a 'common SL' flash array 1200 using the cell embodiment disclosed in FIG. 3. For example, the array 1200 comprises cells, for example, cell 1202, that are constructed as the cell embodiment shown in FIG. 3. In the array 1200, multiple bit lines are coupled to a common SL line.

FIG. 13 shows an exemplary embodiment of a 'parallel BL/SL' flash array 1300 using the cell embodiment disclosed in FIG. 2. For example, the array 1300 comprises cells, for example, cell 1302, that are constructed as the cell embodiment shown in FIG. 2. In the array 1300, each bit line is coupled to a separate SL line.

FIG. 14 shows an exemplary embodiment of a 'parallel BL/SL' flash array using the cell embodiment disclosed in FIG. 3. For example, the array 1400 comprises cells, for example, cell 1402, that are constructed as the cell embodiment shown in FIG. 3. In the array 1400, each bit line is coupled to a separate SL line.

In another exemplary embodiment, the array contains dual-cells to enhance data integrity. In this embodiment, each data bit is stored in two cells. One cell stores the data value and the other cell store the complement of the data value. The two cells are located in two bit lines called BL and BLB. The two bit lines can be located in one array or two separated arrays. When read, both cells are read and their cell current is compared to determine the data value that is stored.

Moreover, in another exemplary embodiment, the cell may be made by using NMOS devices. The bias conditions for this embodiment is similar to the previously described bias conditions for cells made of PMOS devices, except that the polarity of the voltages shall be reversed to account for the operational differences between PMOS and NMOS devices.

Figure 15:
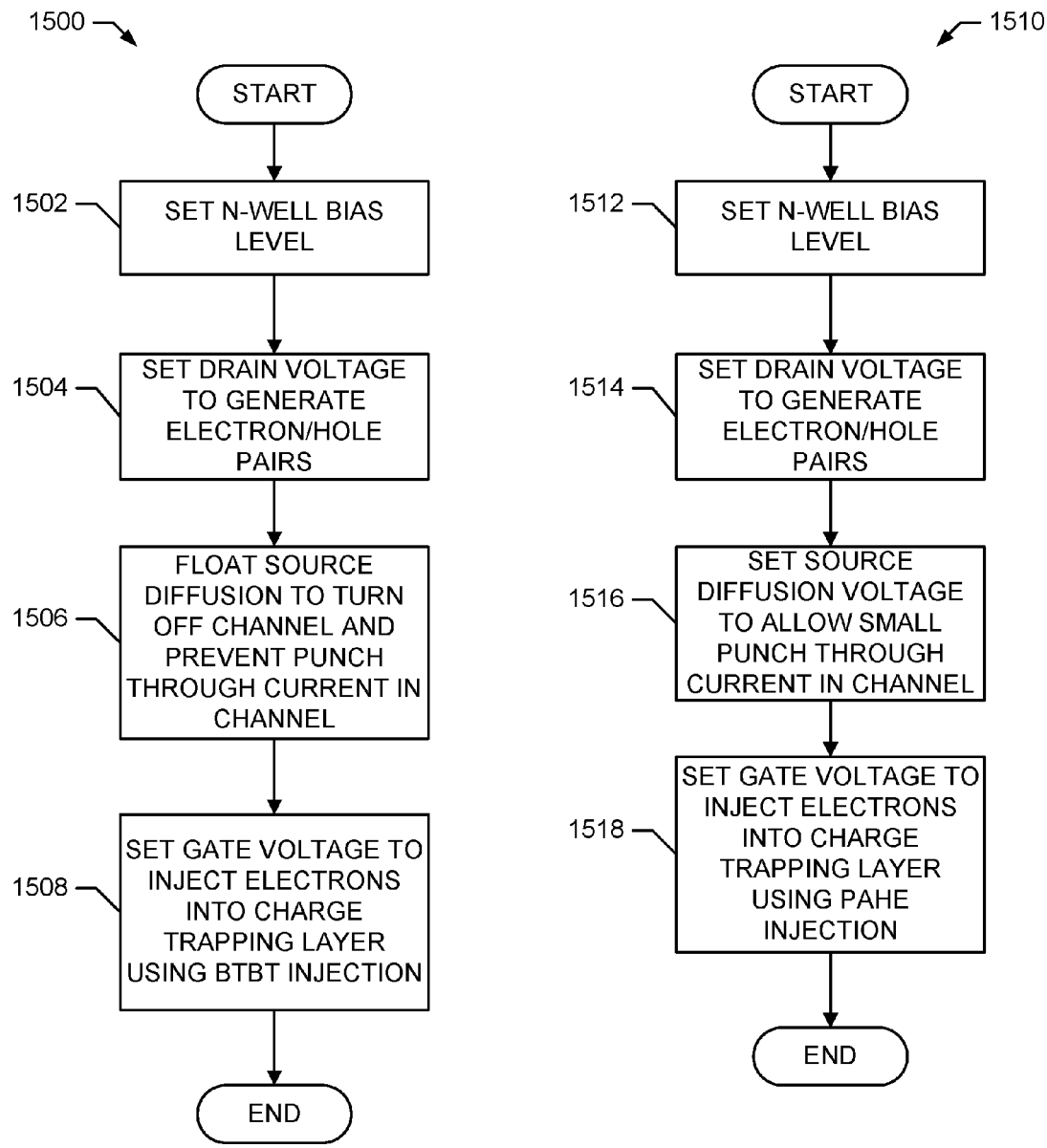
FIG. 15 shows exemplary methods for biasing a novel memory cell in accordance with the invention.

FIG. 15 shows exemplary methods 1500 and 1510 for biasing a novel memory cell in accordance with the invention. For example, the methods 1500 and 1510 are suitable with an array comprising embodiments of a memory cell as illustrated in FIG. 6. For example, the memory cell shown in FIG. 6 comprises a select transistor 212 with a short channel length and a control transistor 213 also having a short channel length. It should also be noted the that methods 1500 and 1510 are also suitable for use with other exemplary embodiment of the novel memory cells.

In an exemplary embodiment, the method 1500 operates to program the memory cell (e.g., the memory cell illustrated in FIG. 6) using BTBT injection.

At block 1502, an N-well bias level is set. For example, in an exemplary embodiment, the controller 104 supplies the N-well 210 with a high voltage signal, such as 5V to 6V, using the NW bias 114.

At block 1504, a drain voltage is set to generate electron/hole pairs in a drain region. For example, in an exemplary embodiment, the controller 104 supplies the BL 112 with a low voltage signal, such as 0V to −1V. The voltage difference between the BL 112 and the N-well 210 will cause avalanche breakdown to occur in the drain junction of the storage transistor 213, which will generate many electron-hole pairs at this junction, as indicated at 602.

At block 1502, a source diffusion is set to a floating condition to turn off a channel associated with the storage device. For example, in an exemplary embodiment, the controller 104 supplies the source region 207 with a low voltage, such as 1-2V (e.g., VDD) using the SL control signal 110. This low voltage can be directly supplied from VDD that is typically 1.2V or 1.8V. This significantly reduces the VDS of the transistor 212 to 1-2V, instead of 5V as used in conventional circuits. Therefore, the channel 215 length of the transistor 212 can be short (e.g., less than 90 nm and down to 10 nm) due to the lower VDS. The select gate 201 is supplied with VDD to turn off the select gate transistor 212. This causes the source region 208 of the transistor 213 to be floating which turns off the channel associated with the transistor 213 and therefore the cell (storage transistor 213) can be programmed by BTBT injection.

At block 1508, a gate voltage is set to inject electrons into a charge-trapping layer using BTBT injection. For example, in an exemplary embodiment, the controller 104 supplies the control gate 203 of the transistor 213 with a high voltage signal, such as 5-7V, using the control gate signal 108. This voltage will attract electrons to inject into the charge-trapping layer 205, as indicated at 604. The result is that the cell (e.g., storage transistor 213) is programmed to be an "on-cell" using BTBT injection.

Thus, the method 1500 operates to program the memory cell (e.g., the memory cell illustrated in FIG. 6) using BTBT injection.

In an exemplary embodiment, the method 1510 operates to program the memory cell (e.g., the memory cell illustrated in FIG. 6) using PAHE injection.

At block 1512, an N-well bias level is set. For example, in an exemplary embodiment, the controller 104 supplies the N-well 210 with a high voltage signal, such as 5V to 6V, using the NW bias 114.

At block 1514, a drain voltage is set to generate electron/hole pairs in a drain region. For example, in an exemplary embodiment, the controller 104 supplies the BL 112 with a low voltage signal, such as 0V to −1V. The voltage difference between the BL 112 and the N-well 210 will cause avalanche breakdown to occur in the drain junction of the storage transistor 213, which will generate many electron-hole pairs at this junction, as indicated at 602.

At block 1516, a source voltage is set to allow a small punch through current to pass in the channel of the storage device (e.g., transistor 213). For example, in an exemplary embodiment, the controller 104 supplies the select gate 201 with a low voltage, such as 0V to −1V, to turn on the select gate transistor 212. The SL voltage at the diffusion 207 (e.g., 1-2V) will pass through the channel 215 of the transistor 212 to the source diffusion 208 of the transistor 213. The voltage on the source diffusion 208 will cause the transistor 213 to experience punch-through, especially since the channel length 214 of the transistor 213 is reduced in accordance with the invention. A small punch through current 606 will flow through the channel of the transistor 213. The typical punch-through current is approximately 1 nA to 1 uA, depending on the voltage and channel length.

At block 1508, a gate voltage is set to inject electrons into a charge-trapping layer using PAHE injection. For example, in an exemplary embodiment, the controller 104 supplies the control gate 203 of the transistor 213 with a high voltage signal, such as 5-7V, using the control gate signal 108. This voltage will attract electrons to inject into the charge-trapping layer 205, as indicated at 604. The small punch through current 606 will accelerate the electrons (shown at 602) at the drain junction to become 'hot' electrons, and thus greatly increase the efficiency of the injection of electrons into the charge-trapping layer 205 (shown at 604). PAHE injection programming may increase the programming speed by one order of magnitude over BTBT injection programming. The result is that the cell (e.g., storage transistor 213) is programmed to be an "on-cell" using PAHE injection.

Thus, the method 1510 operates to program the memory cell (e.g., the memory cell illustrated in FIG. 6) using PAHE injection.

It should be noted that the voltage values shown in the description and figures are exemplary and do not limit the described voltages to exact voltage values. It is obvious that the actual voltages used depend on the technology, process, and/or other factors. It should also be noted that the disclosed cells and bias conditions can be utilized with any type of array structures and that the bias conditions are not limited to specific array types.

While exemplary embodiments of the present invention have been shown and described, it will be obvious to those with ordinary skills in the art that based upon the teachings herein, changes and modifications may be made without departing from the exemplary embodiments and their broader aspects. Therefore, the appended claims are intended to encompass within their scope all such changes and modifications as are within the true spirit and scope of the exemplary embodiments of the present invention.

What is claimed is:

1. An apparatus, comprising:
a control gate transistor having source and drain diffusions deposited in an N-well, a charge-trapping region formed on the N-well that overlaps the source and drain diffusions, and a control gate formed on the charge-trapping region, and wherein a channel region of the N-well between the source and drain diffusions is less than 90 nm in length; and
a select gate transistor having a select source diffusion deposited in the N-well, wherein a drain side of the select gate transistor shares the source diffusion, and wherein a channel region of the N-well between the select source diffusion and the source diffusion is less than 90 nm in length.

2. The apparatus of claim 1, wherein the channel region of the N-well between the source and drain diffusions is 60-90 nm in length.

3. The apparatus of claim 1, wherein the channel region of the N-well between the select source diffusion and the source diffusion is 60-90 nm in length.

4. The apparatus of claim 1, wherein the channel region of the N-well between the source and drain diffusions and the channel region of the N-well between the select source diffusion and the source diffusion are less than 30 nm is length.

5. The apparatus of claim 1, wherein the charge-trapping layer comprises an Oxide-Nitride-Oxide (ONO) layer.

6. The apparatus of claim 1, wherein the charge-trapping layer comprises a floating gate layer.

7. The apparatus of claim 1, wherein the control gate transistor and the select gate transistor comprise PMOS devices.

8. The apparatus of claim 1, wherein the control gate transistor and the select gate transistor comprise NMOS devices.

9. The apparatus of claim 1, wherein the control gate transistor and the select gate transistor form a flash memory cell.

10. The apparatus of claim 9, further comprising a controller that communicates control gate (CG), select gate (SG), bit line (BL), source line (SL), and N-well (NW) signals with the flash memory cell.

11. The apparatus of claim 10, wherein the controller controls the CG, SG, BL, SL, and NW signals to program the flash memory cell using Band-to-Band-Tunneling (BTBT) injection.

12. The apparatus of claim 11, wherein the controller sets program bias conditions to program the flash memory cell using the BTBT injection, and wherein the program bias conditions comprise (SL=VDD), (BL=0 volts), (SG=VDD), (N-well=5 volts), and (CG=5 volts).

13. The apparatus of claim 11, wherein the controller controls the CG, SG, BL, SL, and NW signals to disable the select gate transistor during the BTBT injection to float the source diffusion and disable the channel region of the N-well between the source and drain diffusions.

14. The apparatus of claim 10, wherein the controller controls the CG, SG, BL, SL, and NW signals to program the flash memory cell using Punch-Through-Assisted-Hot-Electron (PAHE) injection.

15. The apparatus of claim 14, wherein the controller sets program bias conditions to program the flash memory cell using the PAHE injection, and wherein the program bias conditions comprise (SL=VDD), (BL=0 volts), (SG=0 volts), (N-well=5 volts), and (CG=5 volts).

16. The apparatus of claim 14, wherein the controller controls the CG, SG, BL, SL, and NW signals to enable the select gate transistor during the PAHE injection to set a selected voltage level on the source diffusion to enable a punch through current to flow in the channel region of the N-well between the source and drain diffusions to enable the PAHE injection.

* * * * *